(12) United States Patent
Bockmeyer et al.

(10) Patent No.: US 9,142,800 B2
(45) Date of Patent: Sep. 22, 2015

(54) SUBSTRATE GLASS FOR LEDS WITH LAYER CONTAINING SCATTERING PARTICLES AND METHOD FOR PRODUCTION THEREOF

(75) Inventors: Matthias Bockmeyer, Mainz (DE); Eveline Rudigier-Voigt, Mainz (DE)

(73) Assignee: SCHOTT AG, Mainz (DE)

( * ) Notice: Subject to any disclaimer, the term of this patent is extended or adjusted under 35 U.S.C. 154(b) by 486 days.

(21) Appl. No.: 12/850,327

(22) Filed: Aug. 4, 2010

(65) Prior Publication Data

US 2011/0045259 A1 Feb. 24, 2011

(30) Foreign Application Priority Data

Aug. 5, 2009 (DE) .......................... 10 2009 036 134

(51) Int. Cl.
*H01L 51/52* (2006.01)
*G02B 5/02* (2006.01)

(52) U.S. Cl.
CPC .............. *H01L 51/5268* (2013.01); *G02B 5/02* (2013.01); *H01L 2251/5369* (2013.01); *Y10T 428/24942* (2015.01); *Y10T 428/25* (2015.01)

(58) Field of Classification Search
CPC ................... H01L 51/5268; H01L 2251/5369; H01L 51/52; Y10T 428/25
See application file for complete search history.

(56) References Cited

U.S. PATENT DOCUMENTS

| | | | | |
|---|---|---|---|---|
| 5,991,493 A | * | 11/1999 | Dawes et al. | 385/141 |
| 2003/0184219 A1 | * | 10/2003 | Duggal et al. | 313/506 |
| 2006/0255716 A1 | * | 11/2006 | Tsutsumi et al. | 313/502 |
| 2009/0046379 A1 | * | 2/2009 | Kuramoto et al. | 359/718 |

FOREIGN PATENT DOCUMENTS

| | | |
|---|---|---|
| DE | 102004035965 | 6/2006 |
| JP | 2001356207 | 12/2001 |
| JP | 2004034399 A * | 2/2004 |
| WO | WO03/061028 | 7/2003 |

OTHER PUBLICATIONS

Sharp, The Penguin Dictionary of Chemistry—Optical Activity definition, 2003, Penguin Books, Third edition, pp. 285-286.*
Pawelec, Metal Oxides Chemistry and Applications—Chapter 5, 2006, CRC Press, pp. 111-131.*
English Translation of International Preliminary Report on Patentability corresponding to International Patent Application No. PCT/EP08/10349 dated Oct. 7, 2010.

* cited by examiner

*Primary Examiner* — Elizabeth A Robinson
(74) *Attorney, Agent, or Firm* — Ohlandt, Greeley, Ruggiero & Perle, LLP

(57) ABSTRACT

A composite material for LED's is provided. The composite material has a coating comprising scattering particles with an index of refraction greater than 1.6.

16 Claims, 2 Drawing Sheets

SUBSTRATE GLASS FOR LEDS WITH LAYER CONTAINING SCATTERING PARTICLES AND METHOD FOR PRODUCTION THEREOF

CROSS REFERENCE TO RELATED APPLICATIONS

This application claims benefit under 35 U.S.C. §119(a) of German Patent Application No. 10 2009 036 134.0, filed Aug. 5, 2009, the entire contents of which are incorporated herein by reference.

BACKGROUND OF THE INVENTION

1. Field of the Invention

The invention relates to a composite material that is designed in particular as a substrate glass for light emitting diodes ("LED's"), and a method for the production thereof.

2. Description of Related Art

Organic LED's (usually called OLED's) have been continuously further developed improved in recent years, which addresses efficiency and service life. Nevertheless there is a great need for improving such LED's, especially to be able to make products available that are competitive with conventional LED technology.

Usually, only about 20 to 25% of the light produced in the emitter layer is emitted by LED's. A large fraction of the light generated remains in guided optical modes within the organic layers or the substrate. A portion of this loss of light can be attributed to total reflections at the substrate/air interface.

Possibilities are known from the state of the art for reducing these losses of light.

A simple method for increasing the light decoupling is to apply a layer that diffusely scatters the light and thus reduces the fraction of light that is lost by total reflection. It is known how to introduce scattering particles, for example, into a light-transmitting substrate. Such light-scattering layers with a transmitting matrix are described, for example, in JP 2001 356207.

These approaches to a solution are based on the scattering properties of the dispersed particles introduced, which have a different index of refraction than the adjacent medium. Because of the deflection at the phase boundaries, fewer photons remain captured in the layer.

It is also known how to introduce foreign bodies, especially microparticles or nanoparticles, into an organic electroluminescent material.

The document WO 03/061028 A2 shows a light-emitting structural element in the form of an OLED in which microparticles are embedded in a polymer layer in order to increase the light decoupling coefficient.

Another approach to a solution is to introduce a color conversion layer that functions as a filter and is formed based on a resin transparent to light into which a light-emitting material is introduced, which, on the one hand, absorbs the light of the OLED and, on the other hand, emits fluorescent light in the visible region. The drawback here is that because of the polarizing mechanism of action, the efficiency is reduced by the previously described losses of light.

The document DE 102004035965 shows an OLED with a scattering cover that has inorganic particles or a structured interface. A polymer is used as the embedding material for the inorganic scattering particles.

An important drawback of such layered systems based on organic polymers is the low thermal and mechanical resistance, which limits subsequent processing steps, and in many cases the lack of long-term stability.

Also, the polymers used usually have an index of refraction below or equal to 1.5. For this reason, layers based on organic polymers usually lead to high losses of light because of total reflections at the substrate/polymer layer interface.

OBJECT OF THE INVENTION

Thus the object underlying the invention is to make available a substrate for LED's that is easy to produce, in which losses of light due to total reflections are reduced.

The composite material according to the invention is also to have adequate thermal and mechanical resistance and adequate durability.

SUMMARY OF THE INVENTION

The invention relates to a composite material that involves, in particular, a substrate glass for LED's.

The composite material comprises a transparent substrate, preferably glass, with an index of refraction greater than or equal to 1.5, preferably greater than or equal to 1.6, with special preference greater than or equal to 1.7, with a coating comprising scattering centers that comprises nanoparticles embedded in a matrix, the nanoparticles having an index of refraction greater than or equal to 1.9, preferably greater than or equal to 2.1, and the coating having an index of refraction greater than 1.60, preferably greater than or equal to 1.7. The nanoparticles are preferably present in the coating, in particular with reference to the matrix, with a fraction by volume of greater than or equal to 10%, preferably greater than or equal to 20%.

In a generalized configuration of the invention, the composite material comprises a transparent substrate with an index of refraction greater than 1.5. The substrate glass has a coating comprising scattering centers on at least one side. According to the invention, the coating comprises nanoparticles embedded in a matrix, preferably consisting of an oxide, and has an index of refraction greater than 1.6.

The inventors have discovered that indices of refraction of greater than 1.6 can be achieved, especially with a hybrid polymer matrix in which high-refracting nanoparticles, preferably oxide particles, are embedded.

The hybrid polymer matrix is formed as an organic/inorganic hybrid polymer matrix. Because of the inorganic constituents, a coating can be provided with a high temperature stability and with a high long-term durability. At the same time, the index of refraction of the composite is usually increased by the inorganic constituents of the matrix. Furthermore, the hybrid polymer matrix is distinguished from purely organic layered systems by greater strength as a rule.

In a preferred configuration of the invention, the hybrid polymer matrix has an inorganic degree of condensation of greater than or equal to 50%, preferably greater than 70%.

An organic/inorganic hybrid polymer matrix, especially as a sol-gel layer, can be applied very easily and quickly compared to purely inorganic layers. In the context of the invention, a hybrid polymer matrix also means a matrix whose organic constituents have at least partially decomposed because of a thermal hardening process.

The organic/inorganic hybrid polymer matrix in particular is filled with nanoparticles composed of or comprising a condensate of one or more hydrolyzable and condensable or condensed silanes and/or metal alkoxides, preferably of Ti, Zr, Al, Nb, Hf, and/or Ge, and/or their thermal rearrangement or decomposition products. The nanoparticles are preferably oxide nanoparticles.

For example, these condensable constituents can be from the group of acrylosilanes, epoxysilanes, acryloalkoxysilanes, acryloepoxysilanes, epoxyalkoxysilanes, allylsilanes, vinylsilanes, fluoroalkylsilanes, aminosilanes, alkoxysilanes, metal alcoholates, metal oxide acrylates, metal oxide methacrylates, and/or metal oxide acetylacetonates.

They are especially the following substances, for example: Methacryloxypropylsilane, glycidylpropylsilane, zirconium secondary butoxide acrylate, titanium ethoxide acrylate, titanium propoxide acrylate, zirconium secondary butoxide methacrylate, titanium ethoxide methacrylate, titanium propoxide methacrylate, tetraethoxysilane, tetramethoxysilane, methyltriethoxysilane, methyltrimethoxysilane, ethyltrimethoxysilane, propyltrimethoxysilane, mercaptopropyltrimethoxysilane, aminopropylsilane, vinyltriethoxysilane, allyltriethoxysilane, phenyltriethoxysilane, triethoxysilylpropylsuccinic anhydride, and/or fluorooctylsilane.

The condensate is characterized in that the inorganic degree of condensation of the hydrolyzate is equal to or greater than 50%, preferably greater than 70%.

A coating with an index of refraction greater than 1.7, or even greater than 1.75, can be made available with the invention.

In an embodiment of the invention, scattering particles with an average diameter between 50 nm and 300 µm, preferably between 150 nm and 2 µm, are used as scattering centers. The scattering centers are preferably embedded in the matrix together with the nanoparticles.

The coating is preferably designed to scatter diffusively, at least in sections.

The nanoparticles, in particular, formed as oxide particles, are preferably used to increase the index of refraction of the coating and therefore have an index of refraction between 0.5 and 2 higher than the index of refraction of the matrix in a preferred embodiment of the invention.

The coating may also contain non-oxide nanoparticles, in particular, fluorides, phosphates, tellurides, sulfides, nitrides, carbides, selenides, and/or mixtures thereof.

It is also conceivable to embed nanoparticles with photoluminescent properties in the matrix.

Nanoparticles with photoluminescent properties, for example, can be composed of or comprise the following base materials doped with main group elements and/or subgroup elements and/or rare earths: $Y_2O_3$, $LaPO_4$, $YVO_3$, $ZnSiO_3$, $ZnGeO_3$, $ZrGeO_3$, $YAlO_3$, $Y_3Al_5O_{12}$, $SrAl_2O_4$, $Sr_4Al_{14}O_{25}$, (Ca, Sr, Ba)S, (Ca, Sr, Ba)(Ga, Al, Y)$_2$S$_4$, (Ca, Sr, Ba)Si$_2$N$_2$O$_2$, SrSiAl$_2$O$_3$N$_2$, (Ca, Sr, Ba)$_2$Si$_5$N$_8$ and/or CaAlSiN$_3$. Dopants can be Dy, Mn, Eu, Er, Nd, Mn, Zn, Sb, Ce, Y, Gd, Tb and/or Lu, for example, especially in various oxidation states.

The coating usually has a lower index of refraction than the substrate to reduce or prevent total reflections at the interface of the substrate coating.

The nanoparticles in a preferred embodiment of the invention, in particular in the configuration as oxide particles, have an average diameter between 0.5 and 200 nm, preferably between 4 and 25 nm. Especially in the last-mentioned range, the nanoparticles, particularly in the configuration as oxide particles, are not optically active within the coating but contribute primarily to increasing the index of refraction.

In a preferred embodiment according to the invention, these nanoparticles are embedded reactively in the network of the layer. This means that a chemical reaction of the preferred oxide surface and its hydroxyl groups with the organic or inorganic crosslinkable functionalities of the matrix has taken place.

The nanoparticles are preferably chemically combined with silanol groups and/or other hydroxyl groups of metal oxides and/or their organometallic or hybrid polymer compounds.

In this preferred embodiment, therefore, no pores are formed between the nanoparticles and the surrounding layer, which otherwise would lead to a lowering of the index of refraction of the layer material.

A preferred hybrid polymeric matrix according to the invention with an index of refraction greater than or equal to 1.65, preferably greater than or equal to 1.7, is composed of or comprises more than or equal to 10 percent by volume, preferably more than or equal to 20 percent by volume, of high-refracting nanoparticles. High-refracting nanoparticles have an index of refraction greater than or equal to 1.9, preferably greater than or equal to 2.1.

In a special embodiment according to the invention, constituents of the matrix can be polysiloxanes. For example, these can be methyl- and/or phenylpolysiloxanes that are terminated, for example, by hydroxyl, glycidyl, and/or polyether.

It is a characteristic of a special embodiment that organic additives, for example, such as dipentaerythritol pentaacrylate, hexanediol diacrylate, trimethylolpropane triacrylate, and/or succinic anhydride are added to the coating as hardeners.

A thickener, for example, such as polydisperse silicic acid, cellulose, and/or xanthan, can be used in the sol-gel precursor for the preparation of layers according to the invention.

In a particular embodiment according to the invention, additives such as leveling aids, which can originate from the substance class of polyether-modified dimethylsiloxanes, for example, are added to the sol-gel coating solutions.

The invention also relates to a method for preparing a composite material.

A transparent substrate is provided with an index of refraction above 1.6, preferably above 1.7. A glass substrate is used, in particular. The composition of the substrate glass, for example, is composed of or comprises the following oxides in various compositions: $SiO_2$, $B_2O_3$, $Bi_2O_3$, $P_2O_5$, $K_2O$, $Cs_2O$, SrO, $GeO_2$, $Al_2O_3$, $Li_2O$, $Na_2O$, CaO, BaO, ZnO, $La_2O_3$, $Gd_2O_3$, $Y_2O_3$, $Ta_2O_5$, $Nb_2O_5$, $TiO_2$, $ZrO_2$, $WO_3$, $As_2O_3$, $Sb_2O_3$, $TiO_2$ and/or $ZrO_2$.

A sol-gel material comprising nanoparticles, preferably provided as oxide particles, and scattering particles to produce scattering centers, is applied to the glass substrate and the sol-gel material is then hardened.

The sol-gel material is hardened, in particular, after completion of hydrolysis and condensation, by a thermal method.

In a special embodiment the hardening can also occur based on UV. In a special embodiment, the hardening is carried out by a combination of UV hardening and thermal hardening.

The sol-gel material can be applied readily even on large surfaces, for example, by dipping, spraying, roller coating, flooding, ink jet, pad printing, flexographic printing, screen printing, etc.

It is especially beneficial when using hybrid polymer layers, in contrast to purely inorganic sol-gel layers, that they can be applied crack-free as dense, thick-layered systems with layer thicknesses greater than 500 nm, preferably greater than 1 µm. Hybrid polymer-based layer systems, like purely organic layer systems, can also be cured in special embodiments by means of UV hardening. Screen printing represents an especially preferred method of application.

The groups crosslinking by inorganic hydrolysis or condensation in the sol-gel process can be the following functional groups, for example:

$TiR_3$, $ZrR_3$, $SiR_4$, $AlR_3$, $TiR_3(OR)$, $TiR_2(OR)_2$, $ZrR_2(OR)_2$, $ZrR_3(OR)$, $SiR_3(OR)$, $SiR_2(OR)_2$, $TiR(OR)_3$, $ZrR(OR)_3$, $AlR_2(OR)$, $AlR_1(OR)_2$, $Ti(OR)_4$, $Zr(OR)_4$, $Al(OR)_3$, $Si(OR)_4$, $SiR(OR)_3$, and/or $Si_2(OR)_6$, and/or one of the following substances or groups of substances with OR: alkoxy such as preferably methoxy, ethoxy, n-propoxy, i-propoxy, butoxy, isopropoxyethoxy, methoxypropoxy, phenoxy, acetoxy, propionyloxy, ethanolamine, diethanolamine, triethanolamine, methacryloxypropyl, acrylate, methyacrylate, acetylacetone, ethyl acetoacetate, ethoxyacetate, methoxyacetate, methoxyethoxyacetate and/or methoxyethoxyethoxyacetate, and/or one of the following substances or groups of substances with R: Cl, Br, F, methyl, ethyl, n-propyl, butyl, ally, vinyl, glycidylpropyl, methacryloxypropyl, aminopropyl, and/or fluorooctyl.

Oxides in particular are introduced as nanoparticles.

The following nanoparticle materials can be used, for example: $TiO_2$ (anatase or rutile), $ZrO_2$, $Y_2O_3$-stabilized $ZrO_2$, CaO-stabilized $ZrO_2$, MgO-stabilized $ZrO_2$, $CeO_2$-stabilized $ZrO_2$, MgO, CaO, pyrochlores of Zr/Ti/Hf/Nb such as $SmTi_2O_7$, $LaZr_2O_7$, $CeTi_2O_7$, $CeO_2$, $La_2O_3$, $LaHf_2O_7$, Gd-doped $CeO_2$, $HfO_2$, Al-doped ZnO, In-doped ZnO, Sb-doped ZnO, $SnO_2$ and/or ZnO.

It is especially preferred to use nanoparticles dispersed in nonaqueous, preferably alcoholic or nonpolar solvents. The nanoparticles for this purpose are preferably stabilized by means of surface-active reagents. For example, these can be tetramethylammonium hydroxide, polyethylene, poly(lactic acid), poly(amino acid), polycaprolactone, para-toluenesulfonic acid, poly(alkyl cyanoacrylate), and/or polyethylene oxide-block-poly(glutamic acid).

In an enhancement of the invention, a photoinitiator is admixed with the sol-gel material and hardening is carried out by means of electromagnetic waves, especially by means of UV light. Radical photoinitiators, for example, 1-hydroxycyclohexyl phenyl ketone and/or benzophenone are preferably used as UV initiators for acrylatie- or methacrylate-based layer systems. Cationic photoinitiators, for example, from the group of iodonium salts, sulfonium salts, and/or nonionic photoinitiators, for example, such as diphenyliodonium nitrate, diphenyliodonium triflate, diphenyliodonium p-toluenesulfonate, N-hydroxynaphthalimide triflate, N-hydroxyphthalimide triflate, thiobis(triphenylsulfonium hexafluorophosphate), and/or (4-methylphenyl)[4-(2-methylpropyl)phenyl](−1)hexafluorophosphate, are preferably used for glycidyl-based sol-gel layers.

Thus the sol-gel layer can be stabilized in a very simple way, and as is provided for in a preferred embodiment of the invention, in subsequent steps, it can be thermally hardened or baked in.

Organic peroxides, for example, in the form of diacyl peroxides, peroxydicarbonates, alkyl peresters, dialkyl peroxides, perketals, ketone peroxides, and/or alkyl hydroperoxides are preferably used as thermal initiators. Dibenzoyl peroxide, tert-butyl perbenzoate, and/or azobisisobutyronitrile are examples of such thermal initiators. 1-Methylimidazole is an example of a cationic thermoinitiator.

Oxide particles with an index of refraction greater than 2.0, with special preference greater than 2.2, are preferably added.

The thermal hardening is carried out in a preferred embodiment of the invention between 100 and 500° C.

The scattering particles can be composed of oxide and/or non-oxide and/or crystalline and/or vitreous materials. For example, the scattering particles can be composed of or comprise titanium oxide (anatase and/or rutile), zirconium oxide, $Y_2O_3$-doped zirconium oxide, CaO-doped zirconium oxide, MgO-doped zirconium oxide, $CeO_2$-doped zirconium oxide, aluminum oxide, mullite, silicon oxide, tin oxide, indium-doped zinc oxide, Al-doped ZnO, $LaPO_4$, $CeO_2$, and/or $BaF_2$.

The particulate form of the scattering particles can be either irregular or orderly, or regularly symmetrical, in particular, spherical, cubic, square, rectangular, pyramidal, tetrahedral, etc.

In a special embodiment, the scattering particles can be in the form of nanotubes, whiskers, and/or fibers.

Irregularly shaped scattering particles can be produced by flame pyrolysis or grinding processes, for example.

Regularly shaped scattering particles are produced, for example, by precipitation processes, hydrothermal syntheses, and/or by the Stöber process familiar to one skilled in the art.

It is especially preferred to use scattering particles dispersed in nonaqueous, preferably alcoholic or nonpolar solvents. The scattering particles for this purpose are preferably stabilized by means of surface-active reagents. For example, these can be tetramethylammonium hydroxide, polyethylene, poly(lactic acid), poly(amino acid), para-toluenesulfonic acid, polycaprolactone, poly(alkyl cyanoacrylate), polyethylene oxide-block-poly(glutamic acid).

In a particularly preferred embodiment according to the invention, aqueous solutions of finely dispersed nanoparticles, such as those that can be prepared, for example, by the method of hydrothermal treatment of precursor powders, which is familiar to one skilled in the art, or can be purchased commercially, for example, from Sachtleben under the trade name XXS 100, are used to prepare alcoholic nanoparticle dispersions, for example of crystalline $ZrO_2$ or $TiO_2$. These highly concentrated dispersions are covered with a solvent immiscible with water and then mixed with a surface-active reagent. By doing this, the nanoparticles execute a phase interchange and then become finely dispersed in the nonaqueous solvent.

In a special embodiment according to the invention, the crystalline nanoparticles can be obtained as redispersible powders after removal of the solvent.

It is characteristic of a special embodiment according to the invention that the average distance between the scattering particles is greater than half the average particle diameter, by which is also meant in particular the average diameter of the agglomerates.

In an enhancement of the invention, the sol-gel material that forms a hybrid polymer matrix comprises a precursor that cosslinks thermally or by light, in particular, a methacrylate, an acrylate, and/or an epoxide.

The invention also relates to a composite material that can be produced by the method described above. The invention also relates to an LED that comprises a described composite material.

A composite material according to the invention can be produced as follows, for example:

A base lacquer is first prepared as follows:

Preparation of a Base Lacquer According to Example 1:

Methacryloxypropyltriethoxysilane (MPTES), tetraethoxysilane (TEOS), and methyltriethoxysilane (MTEOS) are placed in a container. In this example of embodiment, for example, about 0.6 mole of MPTES, about 0.2 mole of TEOS, and about 0.2 mole of MTEOS are used.

Then, 23 g of distilled water to which 3.44 g of para-toluenesulfonic acid has been added is added slowly to this solution with cooling and stirring. After stirring for 5 min, 700 g of a dispersion in n-butanol of 20 percent by weight anatase nanoparticles and a crystallite size of 10-15 nm is added.

After hydrolysis is complete, which can take about 24 hours, the hybrid polymer sol obtained with reactively embedded, finely dispersed, unagglomerated nanoparticles is diluted with methoxypropanol. A photoinitiator is added to the lacquer formulation. 1% (by weight, if not otherwise stated) of the photoinitiator 1-hydroxycyclohexyl phenyl ketone, which is available under the trade name Irgacure 184®, relative to the viscous hybrid polymer, can be added as the photoinitiator, for example.

Preparation of a Base Lacquer According to Example 2:

Methacryloxypropyltriethoxysilane (MPTES), tetraethoxysilane (TEOS), and methyltriethoxysilane (MTEOS) are placed in a container. In this example of embodiment, for example, about 0.75 mole of MPTES, about 0.2 mole of TEOS, and about 0.005 mole of MTEOS can be used.

Then, 23 g of distilled water to which 3.44 g of para-toluenesulfonic acid has been added is added slowly to this solution with cooling and stirring. After stirring for 5 min, 700 g of a dispersion in n-butanol of 20 percent by weight anatase nanoparticles and a crystallite size of 10-15 nm is added.

This solution is combined with a solution of zirconium propoxide and methacrylic acid. For example, 0.75 mole of MPTES, 0.02 mole of TEOS, and 0.05 mole of MTEOS, as well as a solution of 0.3 mole of zirconium propoxide and 0.3 mole of methacrylic acid can be used.

After hydrolysis is complete, which can take about 24 hours, the hybrid polymer sol obtained with reactively embedded, finely dispersed, unagglomerated nanoparticles is diluted with methoxypropanol. A photoinitiator is added to the lacquer formulation. 1% (by weight, if not otherwise stated) of the photoinitiator 1-hydroxycyclohexyl phenyl ketone, which is available under the trade name Irgacure 184®, relative to the viscous hybrid polymer, can be added as the photoinitiator, for example.

Preparation of a Base Lacquer According to Example 3:

Gycidylpropyltriethoxysilane (GPTES), tetraethoxysilane (TEOS) and methyltriethoxysilane (MTEOS) are placed in a container. For example, about 0.6 mole of GPTES, 0.2 mole of TEOS, and 0.2 mole of MTEOS are used. This solution is combined with a solution of aluminum secondary butoxide and ethyl acetate, for example, 0.1 mole of each. To this solution is then added slowly with cooling and stirring an acidic dispersion of an aqueous nanoparticulate $TiO_2$ dispersion, with methanol and para-toluenesulfonic acid added to it. For example, about 28 g of a $TiO_2$ dispersion with 18 percent anatase by weight and a crystallite size of 7-12 nm, to which have been added about 60 g of methanol and 3.44 g of para-toluenesulfonic acid, can be added. After stirring for 5 min, 660 g of a dispersion in n-butanol of 20 percent by weight anatase nanoparticles and a crystallite size of 10-15 nm is added.

After hydrolysis is complete, which can take about 24 hours, the solvent (for example, methanol/ethanol) is removed in a rotary evaporator. The hybrid polymer sol obtained with reactively embedded, finely dispersed, unagglomerated nanoparticles is diluted with methoxypropanol. A photoinitiator is added to the lacquer formulation. 2% (by weight, if not otherwise stated) of the cationic photoinitiator (4-methylphenyl)[4-(2-methylpropyl) phenyl](−1)hexafluorophosphate (Irgacure 250®), relative to the viscous hybrid polymer, for example, can be added as the photoinitiator.

Preparation of a Base Lacquer According to Example 4:

Tetraethoxysilane (TEOS) and methyltriethoxysilane (MTEOS) are placed in a container. In this example of embodiment, for example, about 0.2 mole of TEOS and about 0.8 mole of MTEOS can be used.

To this solution is then added slowly with cooling and stirring an acidic dispersion of an aqueous nanoparticulate $TiO_2$ dispersion, with methanol and para-toluenesulfonic acid added to it. For example, about 28 g of a $TiO_2$ dispersion with 18 percent anatase by weight and a crystallite size of 7-12 nm, to which have been added about 60 g of methanol and 3.44 g of para-toluenesulfonic acid, can be added. After stirring for 5 min, 660 g of a dispersion in n-butanol of 20 percent by weight anatase nanoparticles and a crystallite size of 10-15 nm is added.

After hydrolysis is complete, which can take about 24 hours, the hybrid polymer sol obtained with reactively embedded, finely dispersed, unagglomerated nanoparticles is diluted with diethylene glycol monoethyl ether and the readily volatile solvent is removed at 100 mbar and 40° C.

Scattering Particles are then Added to the Base Coating:

Depending on the desired scattering activity, 0.1-20% of oxide scattering particles with a size of 100 nm to 1 μm is added to the base lacquer formulation, and is dispersed with a dispersing apparatus.

The Particles Used, in Particular, can be:

a. 2-10 percent by weight of $TiO_2$ prepared by flame pyrolysis (anatase), with an average agglomerated particle size of 80 to 150 nm.

b. 2-10 percent by weight of $ZrO_2$ prepared by flame pyrolysis, with an average agglomerated particle size of 100 to 200 nm.

c. 2-50 percent by weight of monodisperse spherical $SiO_2$ particles with a diameter of 500 nm prepared by the Stöber process.

d. 2-50 percent by weight of monodisperse spherical $SiO_2$ particles with a diameter of 250 nm prepared by the Stöber process.

e. 10-20 percent of $SiO_2$ prepared by flame pyrolysis with a BET surface area of 100-500 $m^2/g$.

f. 5-10 percent of $Al_2O_3$ prepared by flame pyrolysis (gamma-$Al_2O_3$) (agglomerate size 100-200 nm).

g. 1-10 percent of $TiO_2$ prepared hydrothermally (rutile) with an average particle size of 50-80 nm.

h. 1-10 percent by weight of monodisperse pyramidal Al-doped ZnO particles with an average diameter of 200 nm prepared by a precipitation process.

i. 1-10 percent by weight of crystalline $LaPO_4$ particles with an average diameter of 200 nm prepared by a precipitation process.

The Coatings can then be Applied as Follows:

The coatings 1, 2, and 3 are applied by roller coating and a first hardening of the layer is carried out by means of a UV lamp that emits in the wavelength region of about 250 nm. Another UV-based layer hardening then follows. A thermal layer hardening is then carried out.

Formulations based on lacquers 1 and 2 can be cured thermally, in particular at 100-200° C. and in a further step at above 400° C. Formulations based on lacquer 3 can be thermally post-hardened at 100-500° C.

Coating 4 is applied by screen printing and is cured thermally, in particular at 100-200° C., and in a further step at over 350° C.

The average thickness of the hybrid polymer layer of the structured layers is preferably between 300 and 2000 nm.

DETAILED DESCRIPTION OF THE INVENTION

The invention will be explained in further detail below with reference to FIGS. 1 to 3.

Figure 1:
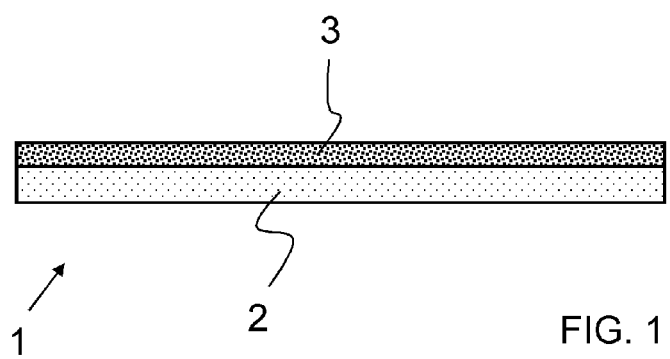
FIGS. 1 and 2 show schematically a composite material in various steps of production.

FIG. 1 shows a composite material 1 that comprises a glass substrate 2 and a coating 3.

The coating 3 is a sol-gel layer to which are added scattering particles of an oxide with an average diameter between 100 nm and 200 μm, and that also comprises oxide nanoparticles to increase the index of refraction.

Losses of light due to total reflection are reduced by the coating 3, which has an index of refraction >1.7.

Figure 2:
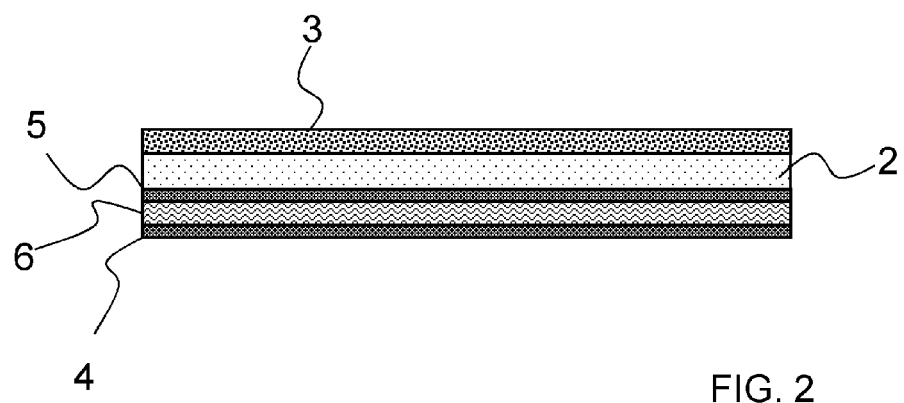

FIG. 2 shows an OLED that comprises the composite material.

Besides the composite material composed of the substrate 2 and the coating 3, the OLED also comprises an emitter layer 6 that is positioned between anode 4 and cathode 5.

The layers of the OLED 4, 5, 6 are directly deposited on the substrate glass 2. In this example of embodiment the coating 3 comprising the scattering particles is positioned on the side opposite the emitter layer 6. It is to be understood that the coating 3 can be adjacent to the OLED layer composite, or that coatings with scattering centers can be placed on both sides of the substrate glass 2.

It is also to be understood that this illustration is of only a schematic nature and that, in particular, in practice, the layered composite of the OLED comprises a plurality of other layers.

Figure 3:
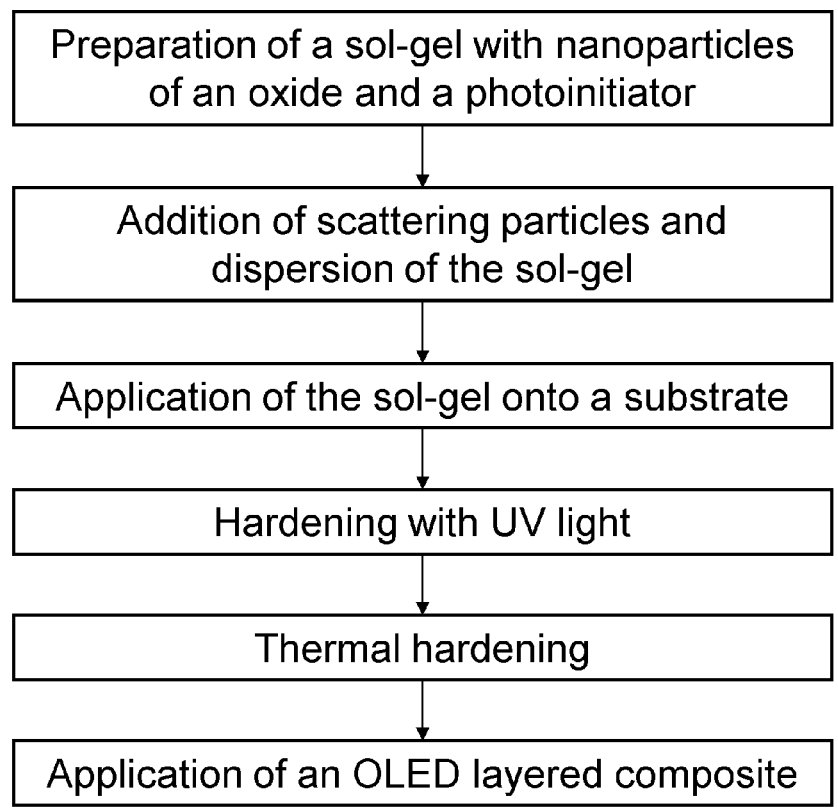
FIG. 3 shows a flow diagram for a schematic example of embodiment.

FIG. 3 shows a flow diagram of an example of embodiment of a method according to the invention.

A sol-gel is first prepared with nanoparticles of an oxide and a photoinitiator.

Scattering particles are then added and the sol-gel is dispersed.

After applying the sol-gel to a substrate, hardening is first carried out with UV light, and then a thermal hardening.

The OLED layered composite can then be applied to the substrate.

It is to be understood that the invention is not limited to a combination of the features described above, but that one skilled in the art will combine all of the described features in any way to the extent that this is meaningful.

What is claimed is:

1. A composite material for light emitting diodes, comprising:
   a transparent glass substrate with an index of refraction greater than 1.6; and
   a coating comprising scattering particles with an average diameter of 150 nm to 2 μm, the coating further comprising oxide nanoparticles with an average diameter of 4 nm to 20 nm embedded in a hybrid polymer matrix, the oxide nanoparticles increasing an index of refraction of the coating and having an index of refraction greater than or equal to 1.9 and between 0.5 and 2.0 higher than an index of refraction of the hybrid polymer matrix, and the index of refraction of the coating being greater than 1.6, the coating having a lower index of refraction than the transparent glass substrate and being a diffusely scattering coating, and wherein the oxide nanoparticles have hydroxyl groups that are chemically cross-linked with inorganic groups of the hybrid polymer matrix.

2. The composite material according to claim 1, wherein the oxide nanoparticles are present in the coating with a fraction by volume of greater than or equal to 10%.

3. The composite material according to claim 1, wherein the oxide nanoparticles are present in the coating with a fraction by volume of greater than or equal to 20%.

4. The composite material according to claim 1, wherein the hybrid polymer matrix has an inorganic degree of condensation greater than or equal to 50%.

5. The composite material according to claim 4, wherein the inorganic degree of condensation is greater than 70%.

6. The composite material according to claim 4, wherein the index of refraction of the coating is greater than 1.7.

7. The composite material according to claim 4, wherein the index of refraction of the coating is greater than 1.8.

8. The composite material according to claim 1, wherein the coating is formed as a sol-gel layer.

9. The composite material according to claim 1, wherein the coating further comprises photoluminescent particles.

10. The composite material according to claim 1, wherein the oxide nanoparticles are stabilized by a surface-active reagent selected from the group consisting of tetramethylammonium hydroxide, polyethylene, poly(lactic acid), poly (amino acid), para-toluenesulfonic acid, polycaprolactone, poly(alkyl cyanoacrylate), polyethylene oxide-block-poly (glutamic acid) and combinations thereof.

11. A composite material for light emitting diodes, comprising:
    a transparent glass substrate with an index of refraction greater than 1.6; and
    a coating comprising scattering particles with an average diameter of 150 nm to 2 μm, the coating further comprising oxide nanoparticles with an average diameter of 4 nm to 20 nm embedded in a hybrid polymer matrix, the oxide nanoparticles increasing an index of refraction of the coating and having an index of refraction greater than or equal to 1.9 and between 0.5 and 2.0 higher than an index of refraction of the hybrid polymer matrix, and the index of refraction of the coating being greater than 1.6, the coating having a lower index of refraction than the transparent glass substrate and being a diffusely scattering coating, and wherein the oxide nanoparticles have hydroxyl groups that are chemically cross-linked with organic groups of the hybrid polymer matrix.

12. The composite material according to claim 11, wherein the oxide nanoparticles are present in the coating with a fraction by volume of greater than or equal to 10%.

13. The composite material according to claim 11, wherein the oxide nanoparticles are present in the coating with a fraction by volume of greater than or equal to 20%.

14. The composite material according to claim 11, wherein the coating is formed as a sol-gel layer.

15. The composite material according to claim 11, wherein the coating further comprises photoluminescent particles.

16. The composite material according to claim 11, wherein the oxide nanoparticles are stabilized by a surface-active reagent selected from the group consisting of tetramethylammonium hydroxide, polyethylene, poly(lactic acid), poly (amino acid), para-toluenesulfonic acid, polycaprolactone, poly(alkyl cyanoacrylate), polyethylene oxide-block-poly (glutamic acid) and combinations thereof.

* * * * *